United States Patent [19]

Martin

[11] 4,126,883
[45] Nov. 21, 1978

[54] PRESSURE-MOUNTED SEMICONDUCTIVE STRUCTURE

[75] Inventor: Heinz Martin, Munich, Germany

[73] Assignee: Siemens Aktiengesellschaft, Berlin & Munich, Germany

[21] Appl. No.: 775,979

[22] Filed: Mar. 9, 1977

[30] Foreign Application Priority Data

Mar. 19, 1976 [DE] Fed. Rep. of Germany ....... 2611749

[51] Int. Cl.² .................... H01L 25/04; H01L 23/32; H01L 23/42
[52] U.S. Cl. ........................ 357/82; 357/55; 357/76; 357/79; 357/81; 174/15
[58] Field of Search ............ 357/55, 76, 79, 82, 357/81; 174/15

[56] References Cited
U.S. PATENT DOCUMENTS

| | | | |
|---|---|---|---|
| 2,826,725 | 3/1958 | Roberts | 357/79 |
| 2,852,723 | 9/1958 | Escoffery | 357/79 |
| 3,457,474 | 7/1969 | Weisshaar et al. | 357/79 |
| 3,475,660 | 10/1969 | Coblenz | 357/82 |
| 3,532,942 | 10/1970 | Boyer | 357/76 |
| 3,643,131 | 2/1972 | Scherbaum | 357/82 |
| 3,646,407 | 2/1972 | Meuleman | 357/55 |
| 3,652,903 | 3/1972 | Eriksson et al. | 357/76 |
| 3,925,802 | 12/1975 | Watanabe | 357/55 |

*Primary Examiner*—Andrew J. James
*Attorney, Agent, or Firm*—Hill, Gross, Simpson, Van Santen, Steadman, Chiara & Simpson

[57] ABSTRACT

A semiconductive structure comprised of a semiconductive element, feed electrodes and other related components thereof, each provided with an aperture aligned with the aperture of the other elements and a single clamping bolt means positioned through the aperture of each component to align the components relative to one another and to exert pressure on the semiconductive component.

4 Claims, 4 Drawing Figures

PRESSURE-MOUNTED SEMICONDUCTIVE STRUCTURE

BACKGROUND OF THE INVENTION

1. Field of the Invention

The invention relates to semiconductive structures and somewhat more particularly to pressure-mounted semiconductive structures. 2. Prior Art Pressure-mounted semiconductive structures are known and generally comprise a semiconductive component positioned between two feed electrodes and connected to such electrodes merely by pressure, i.e., not by soldering, welding, alloying or any other material-lacking manner. For example, German Pat. No. 1,276,209 (generally corresponding to U.S. Pat. No. 3,280,389) shows a semiconductive structure of this type wherein the semiconductor component is enclosed within a disc-shaped housing. Heat-exchange bodies may be positioned against the outer surfaces of the housing to cool the housing and to function as the feed electrodes for the semiconductive structure. The pressure mounting of such elements necessitates means for centering or aligning the semiconductive element relative to the feed electrodes. The semiconductive elements which are pressure-mounted or contacted must be centered relative to the load in order to properly function since an off-center or declined load tends to cause the destruction of the semiconductor element. In this known arrangement, the housing which encloses the semiconductor element is provided with ring-shaped surfaces which extend into the interior of the housing and center the semiconductor element within the housing. The heat-exchange bodies are pressed against the top and bottom surfaces of the housing via clamping bolts. The clamping bolts are positioned within apertures in the heat-exchange body and fit within notches on the outer periphery of the housing so as to center the housing relative to the heat-exchange bodies. In this known semiconductive structure, for example, four clamping bolts are required to provide a functional structure.

In another known semiconductive structure of this type, a semiconductor element is centered within a housing enclosing the semiconductor by blind holes in the top and bottom surfaces of the housing which receive centering pins extending from heat-exchange bodies, and which exert force against the housing. In this arrangement, the top and bottom surfaces of the housing are separated from one another and form the feed electrodes of the structure. A plurality of clamping bolts are distributed about the periphery of this structure to provide the contact pressure required.

In another known semiconductive structure of this type, a semiconductor element is centered within a housing enclosing the semiconductor by interfitting surfaces on the housing and the heat-exchange body (i.e., a part of the housing rests within a recess in the heat-exchange body). Pressure-contact is attained by a plurality of clamping bolts distributed about the periphery of the structure.

Thus, the prior art pressure-contactable or pressure-mounted semiconductive structures require a plurality of clamping bolts and special constructions for centering a semiconductor therein so as to render such structures economically unattractive.

SUMMARY OF THE INVENTION

This invention provides a pressure-mounted semiconductive structure which is relatively simple and which reliably centers a semiconductor element via a single simple clamping means.

In accordance with the principles of the invention, a semiconductor element and at least feed electrodes therefor are each provided with an aperture which receives a clamping means, such as a bolt-nut combination that aligns the semiconductor element relative to the feed electrodes and provides the required pressure. In preferred embodiments of the invention, the apertures within the respective components forming the semiconductive structure are positioned concentrically within each component. In certain embodiments of the invention, a heat-exchange body having a suitably aligned aperture therein for accommodating the clamping means may be positioned against the semiconductor element or a feed electrode and secured thereon via the clamping means.

In a particular construction of the foregoing embodiment, a pair of semiconductor elements, a pair of feed electrodes and a heat-exchange body are each provided with a concentric aperture therein and arranged so that a semiconductor element is positioned on opposite sides of the heat-exchange body and the feed electrodes are positioned on the respective surface of each semiconductor element facing away from the heat-exchange body and the respective apertures of each component are aligned to receive a single clamping bolt means centering and securing such components into a unitary structure. The so-arranged semiconductor elements may be connected in series or opposite to one another.

DESCRIPTION OF THE PREFERRED EMBODIMENTS

The invention provides a pressure-mounted or pressure-contactable semiconductive structure which is relatively simple, reliable and extremely economical.

In accordance with the principles of the invention, each component of a pressure-mounted semiconductive structure is provided with an aperture to receive a single clamping means which centers and presses the components against one another. Thus, at least feed electrodes and a semiconductor element are each provided with an aligned aperture, which is preferably concentric relative to the body having the aperture therein and to the other apertures. A single clamping bolt inserted within such apertures centers the bodies relative to one another and a nut threaded thereon provides the pressure contact required.

Semiconductive structures having a housing provided with an aperture for accommodating a bolt means are known and have been described earlier. The bolt means holds the housing together. Several semiconductor elements and feed electrodes are positioned within the interior of such a housing. Obviously, it is expensive and complicated to produce semiconductive structures of this type because each semiconductor element must be contacted individually. Further, with this type of structure, the available volume within a housing is badly utilized.

The principles of the invention allow one to overcome the above prior art drawbacks and to provide a relatively simple and improved pressure-mounted semiconductive structure.

Figure 1:
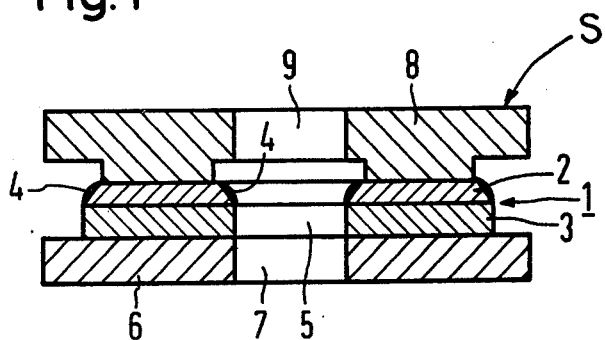
FIG. 1 is an elevated cross-sectional view of an exemplary embodiment of the invention.

Referring now to FIG. 1, a pressure-mounted or pressure-contactable semiconductive structure S is provided with a semiconductor element 1 positioned between two feed electrodes 6 and 8. The semiconductor element 1 consists of a semiconductor body 2 composed, for example, of silicon, and has an electrode 3, for example, composed of molybdenum, alloyed or soldered thereon. Edges of the semiconductor body 2 may be provided with a protective coating 4 or some other suitable passivation layer. The semiconductor element 1 and the feed electrodes 6 and 8 are each provided with a concentric aperture or hole, 5, 7 and 9. The apertures 5, 7 and 9 accommodate a single clamping bolt (not shown for the sake of clarity) which centers the semiconductor element 1 relative to the electrodes 7 and 8 and applies a contacting pressure between the adjacent surfaces thereof. The clamping bolt is electrically insulated, as by a layer of electrical insulating material thereon, not only from the semiconductor element 1 but also from at least one of the electrodes 6 or 8. The clamping bolt has a diameter which is just slightly smaller than the diameter of the holes 5, 7 and 9 and thus readily centers the respective components relative to one another. Simultaneously, the clamping bolt applies, for example, via an appropriate thrust ring, a pressure needed for contacting the semiconductor element 1. Generally, a pressure of about 100 to 500 $kgf/cm^2$ is adequate.

The structure shown at FIG. 1 may be housed within a housing or casing if desired, however, this is not necessary, particularly when the structure is subjected to low inverse voltages. The electrodes 6 and 8 may be component parts of a housing or of a heat-exchange body associated with the illustrated structure. However, the electrodes may also be arranged outside a housing, if one is utilized. For example, the housing may be completed by a sealing ring which is positioned around feed electrodes 6 and 8. Such sealing rings may be composed, for example, of silicon rubber and be inserted into appropriate recesses in a generally known manner to seal the semiconductor element from ambient atmosphere. Upon the application of a pressure to such an arrangement, the rings deform to seal off the interior of the resulting semiconductive structure. Alternatively, the various cavities in the semiconductive structure may be filled, in a known manner, for example, with synthetic material so as to protect the components thereof.

Figure 2:
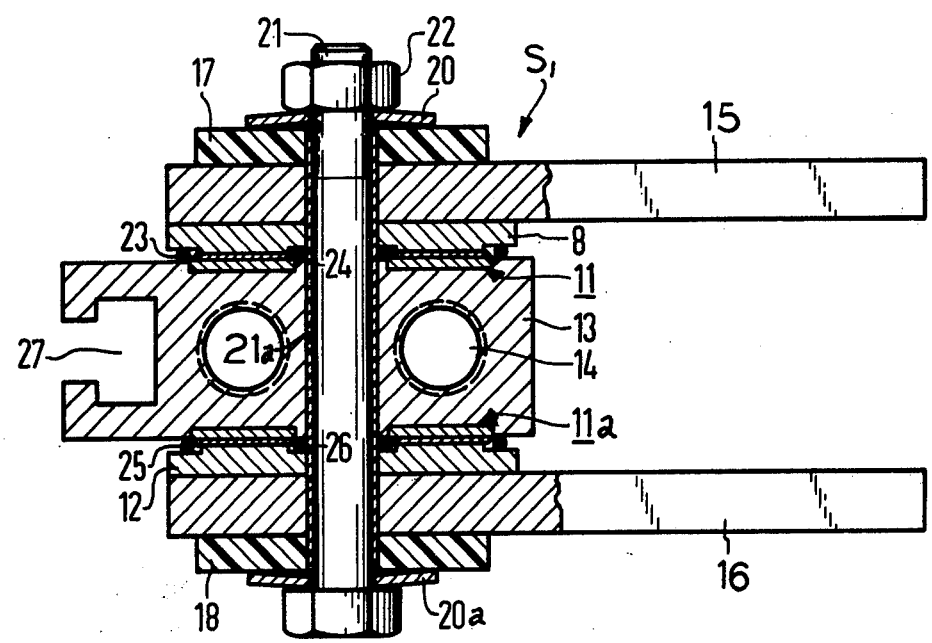
FIG. 2 is a somewhat similar view of a pressure-mounted semiconductive structure constructed in accordance with the principles of the invention.

Referring now to the semiconductive structure $S_1$ illustrated at FIG. 2, a pair of semiconductor elements 11 and 11a are positioned so that a first surface thereof is in contact with a common feed electrode which also is a heat-exchange body 13. The heat-exchange body 13 is provided with fluid passages 14 through which a heat-exchange fluid, such as water or air, is circulated so as to control the temperature of the overall structure. A pair of feed electrodes 8 and 12 are respectively positioned on a second surface of the semiconductor elements 11 and 11a, which is opposite the first surface thereof. On top of each electrode 8 and 12, a contact lead 15 and 16 is mounted and insulating washers 17 and 18 are mounted on the respective leads 15 and 16. Biasing means, such as a thrust washer 20 and 20a are positioned on the outer surface of each insulating washer 17 and 18 and a bolt 21 is inserted through the hole of each of the foregoing elements so as to align such elements relative to one another and a nut 22 threaded onto the bolt 21 to apply contact pressure to the assembled elements and particularly onto the semiconductor elements 11 and 11a. The feed electrodes 8 and 12 are provided with a recess at inner and outer edges thereof, within which sealing rings 23, 24 and 25, 26 are positioned. The bolt 21 may be provided with an insulating layer 21a. Tightening of nut 22 causes the seals 23, 24, 25 and 26 to deform and seal the semiconductor elements from ambient atmosphere.

In the embodiment illustrated, the heat-exchange body 13 which functions as an electrode, is provided with a contact recess 27 for coupling the structure to other electrical elements or to a suitable current source.

The semiconductive elements 11 and 11a may be connected in series or opposite to one another.

In arrangements where the semiconductor elements are connected opposite to one another, the structure shown at FIG. 2 may form a part of a single-phase or a three-phase rectifier bridge. In such arrangements, a single-phase or a three-phase alternating current is supplied to the structure at contact recess 27 and at further similar contact means of additional semiconductive structures similar to that described whereby a rectified current can be collected at leads 15 and 16. In such arrangements, the leads 15 and 16 expediently define common bus-bars for all of the joined semiconductive structures.

In arrangements where both semiconductor elements 11 and 11a are connected in series, the arrangement may be operated as a simple rectifier. In that case, an inverse voltage is supplied to both semiconductive elements.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

I claim as my invention:

1. In a semiconductor structure having a semiconductor component which can be subjected to pressure, the combination comprising:

a heat-exchange body having a mounting aperture therein and having passages spaced from said mounting aperture for circulating a heat-exchange fluid therethrough;

a pair of semiconductor elements positioned on opposing surfaces of said heat-exchange body, each of said semiconductor elements having a concentrically located mounting aperture therein aligned with said mounting aperture of said heat-exchange body;

a pair of electrode means, each having a mounting aperture therein aligned with said mounting aperture of said heat-exchange body, each electrode means being positioned on a surface of a respective semiconductor element face away from said heat-exchange body and having a portion extending away from said semiconductor structure for electrical coupling to an electrical current source; and a clamping bolt means positioned within said apertures to align said semiconductor elements relative to said heat-exchange body and said electrode means and to exert a pressure on said semiconductor element.

2. A pressure-mounted semiconductive structure as defined in claim 1 wherein said semiconductor elements are connected in series.

3. A pressure-mounted semiconductive structure as defined in claim 1 wherein said semiconductor elements are connected opposite to one another.

4. In a semiconductor structure as defined in claim 1 wherein said electrode means comprises a pair of feed electrodes and a pair of contact leads, said feed electrodes and said contact leads each having a mounting aperture therein aligned with said mounting aperture of said heat-exchange body, each respective feed electrode being positioned on a surface of a respective semiconductor element facing away from said heat-exchange body and each respective contact lead being positioned on a surface of a respective feed electrode facing away from each respective semiconductor element.

* * * * *